(12) United States Patent
Chang et al.

(10) Patent No.: US 8,619,465 B2
(45) Date of Patent: Dec. 31, 2013

(54) 8-TRANSISTOR SRAM CELL DESIGN WITH INNER PASS-GATE JUNCTION DIODES

(75) Inventors: Leland Chang, New York, NY (US); Isaac Lauer, Mahopac, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 13/345,629

(22) Filed: Jan. 6, 2012

(65) Prior Publication Data

US 2013/0176770 A1 Jul. 11, 2013

(51) Int. Cl.
*G11C 11/00* (2006.01)
*G11C 11/412* (2006.01)

(52) U.S. Cl.
CPC ................................ *G11C 11/412* (2013.01)
USPC ....... 365/154; 365/189.11; 365/105; 365/175

(58) Field of Classification Search
CPC .......... G11C 7/00; G11C 11/00; G11C 16/06; G11C 11/412
USPC .............. 365/154, 189.11, 105, 175
See application file for complete search history.

(56) References Cited

U.S. PATENT DOCUMENTS

| | | | |
|---|---|---|---|
| 4,933,903 A | 6/1990 | Nakaizumi | |
| 5,477,489 A | 12/1995 | Wiedmann | |
| 5,821,136 A * | 10/1998 | Chan et al. | 438/158 |
| 5,831,897 A | 11/1998 | Hodges | |
| 6,400,206 B2 | 6/2002 | Kim et al. | |
| 6,552,941 B2 | 4/2003 | Wong et al. | |
| 6,934,182 B2 | 8/2005 | Chan et al. | |
| 7,164,596 B1 | 1/2007 | Deng et al. | |
| 7,239,559 B2 | 7/2007 | Adams et al. | |
| 7,514,983 B2 | 4/2009 | Miske | |
| 7,532,501 B2 | 5/2009 | Joshi et al. | |
| 7,564,725 B2 | 7/2009 | Houston | |
| 7,613,054 B2 | 11/2009 | Lee et al. | |
| 7,643,357 B2 | 1/2010 | Braceras et al. | |
| 7,729,159 B2 | 6/2010 | Braceras et al. | |

(Continued)

OTHER PUBLICATIONS

Res Saleh, "SRAM Cell and Column I/O Design," Lecture 18, Dept. of ECE, University of British Columbia, EECE481, Mar. 16, 2005.

(Continued)

*Primary Examiner* — Thong Q Le
(74) *Attorney, Agent, or Firm* — Law Offices of Ira D. Blecker, P.C.

(57) ABSTRACT

An 8-transistor SRAM cell which includes two pull-up transistors and two pull-down transistors in cross-coupled inverter configuration for storing a single data bit; first and second pass-gate transistors having a gate terminal coupled to a write word line and a source or drain of each of the pass-gate transistors coupled to a write bit line; inner junction diodes at shared source/drain terminals of the pass-gate and pull-down transistors oriented to block charge transfer from the write bit line into the cell; and first and second read transistors coupled to the two pull-up and two pull-down transistors, one of the read transistors having a gate terminal coupled to a read word line and a source or a drain coupled to a read bit line. The 8-transistor SRAM cell is adapted to prevent the value of the bit stored in the cell from changing state.

20 Claims, 6 Drawing Sheets

(56) References Cited

U.S. PATENT DOCUMENTS

| | | |
|---|---|---|
| 7,768,816 B2 | 8/2010 | Joshi et al. |
| 7,773,407 B2 | 8/2010 | Huang et al. |
| 7,808,812 B2 | 10/2010 | Liu et al. |
| 7,826,251 B2 | 11/2010 | Chang et al. |
| 2005/0073060 A1 | 4/2005 | Datta et al. |
| 2008/0247221 A1 | 10/2008 | Houston |
| 2010/0226186 A1 | 9/2010 | Houston |
| 2010/0259973 A1 | 10/2010 | Houston |

OTHER PUBLICATIONS

Leland Chang et al., "Stable SRAM Cell Design for the 32 nm Node and Beyond," 2005 Symposium on VLSI Technology Digest of Technical Papers.

Vinod Ramadurai et al., "A Disturb Decoupled Column Select 8T SRAM Cell," IEEE 2007 Custom Intergrated (sic) Circuits Conference (CICC).

Leland Chang et al., "An 8T-SRAM for Variability Tolerance and Low-Voltage Operation in High-Performance Caches," IEEE Journal of Solid-State circuits, vol. 43, No. 4 Apr. 2008.

Keunwoo Kim et al., "Dual-BOX FD/SOI SSRAM Cell With Improved Stability," IEEE Transactions on Electron Devices, vol. 56, No. 12, Dec. 2009.

K. Honda et al., "Elimination of half select disturb in 8T-SRAM by local injected electron asymmetric pass gate transistor", CICC 2010 IEEE.

S. Panda et al., "Power, delay and noise optimization of a SRAM cell using a different threshold voltages and high performance output noise reduction circuit," 2009 International Conference on Computers and Devices for Communication.

A. Carlson et al., SRAM Read/Write Margin Enhancements Using FinFETs, IEEE Transactions on VLSI Systems, vol. 18, #6, Jun. 2010.

Prosecution history for Applicants' related U.S. Appl. No. 13/345,619, filed Jan. 6, 2012, Notice of Allowance dated May 1, 2013.

Prosecution history for Applicants' related U.S. Appl. No. 13/345,636, filed Jan. 6, 2012, Notice of Allowance dated Apr. 30, 2013.

* cited by examiner

8-TRANSISTOR SRAM CELL DESIGN WITH INNER PASS-GATE JUNCTION DIODES

RELATED APPLICATION

This application is related to U.S. patent application Ser. No. 13/345,619 entitled "8-TRANSISTOR SRAM CELL DESIGN WITH SCHOTTKY DIODES", filed even date herewith, and U.S. patent application Ser. No. 13/345,636 entitled "8-TRANSISTOR SRAM CELL DESIGN WITH OUTER PASS-GATE DIODES", filed even date herewith, the disclosures of which are incorporated by reference herein.

BACKGROUND

The present invention relates to 8-transistor SRAM cell designs and, more particularly, relates to an 8-transistor SRAM cell design having inner pass-gate junction diodes to enable column select functionality.

A static random access memory (SRAM) is a significant memory device due to its high speed, low power consumption and simple operation. Unlike a dynamic random access memory (DRAM) cell, the SRAM does not need to regularly refresh the stored data as SRAM uses bistable latching circuitry to store each bit.

As variability concerns mount in future complementary metal oxide semiconductor (CMOS) technologies, SRAM cell stability, which depends on delicately balanced transistor characteristics, becomes a significant concern.

In traditional 6-transistor SRAM, cells must be both stable during a read event and writeable during a write event. Ignoring redundancy, such functionality must be preserved for each cell under worst-case variation. For cell stability during a read, it is desirable to strengthen the storage inverters and weaken the pass-gates. The opposite is desired for cell writeability: a weak storage inverter and strong pass-gates. This delicate balance of transistor strength ratios can be severely impacted by device variations, which dramatically degrade stability and write margins, especially in scaled technologies.

In a 6-transistor SRAM cell, variability tolerance is compromised by the conflicting needs of cell read stability and writeability. Because the same pass-gate devices are used to both read and write the cell, it is inevitable that the two conditions cannot be simultaneously optimized.

In an 8-transistor SRAM cell, two transistors are added to create a disturb-free read mechanism. Since read and write are controlled by separate devices within the cell, the two are entirely decoupled—a level that 6-transistor SRAM cells can never reach. This widens the cell optimization space to achieve sufficient stability and writeability margins.

While the 8-transistor cell solves read stability issues, a similar problem arises during a write operation if column select functionality (also known as half-select, partial write, or masked write) is desired. In such a scenario, the write word line is activated, but it is desired that only some of the bits tied to this write word line are written. This is a common technique used in 6-transistor SRAM arrays to facilitate bit interleaving and array floorplanning and is achieved by appropriately biasing the bit lines in each column. Those bits that are not to be written experience a bias comparable to a read disturb. In 8-transistor SRAM, operating the memory in such a fashion would unintentionally write other bits in other columns due to the strong pass-gates employed. In existing 8-transistor SRAM designs, column select functionality is thus prohibited.

BRIEF SUMMARY

The various advantages and purposes of the exemplary embodiments as described above and hereafter are achieved by providing, according to a first aspect of the exemplary embodiments, an 8-transistor SRAM cell which includes two pull-up transistors and two pull-down transistors in cross-coupled inverter configuration for storing a single data bit; first and second pass-gate transistors having a gate terminal coupled to a write word line and a source or drain of each of the pass-gate transistors coupled to a write bit line, the first and second pass-gate transistors each having a shared source or drain terminal with one of the pull-down transistors; an inner junction diode at each shared source/drain terminal of the shared source/drain terminals oriented to block charge transfer from the write bit line into the cell; and first and second read transistors coupled to the two pull-up and two pull-down transistors, one of the read transistors having a gate terminal coupled to a read word line and a source or a drain coupled to a read bit line; wherein the 8-transistor SRAM cell is adapted to prevent the value of the bit stored in the cell from changing state while the first and second read transistors affect the signal asserted during the read operation on the read bit line coupled to the cell.

According to a second aspect of the exemplary embodiments, there is provided a memory device which includes a plurality of 8-transistor SRAM cells arranged in columns and rows. Each 8-transistor SRAM cell includes two pull-up transistors and two pull-down transistors in cross-coupled inverter configuration for storing a single data bit; first and second pass-gate transistors having a gate terminal coupled to a write word line and a source or drain of each of the pass-gate transistors coupled to a write bit line, the first and second pass-gate transistors each having a shared source or drain terminal with one of the pull-down transistors; an inner junction diode at each shared source/drain terminal of the shared source/drain terminals of the pass-gate and pull-down oriented to block charge transfer from the write bit line into the cell; and first and second read transistors coupled to the two pull-up and two pull-down transistors, one of the read transistors having a gate terminal coupled to a read word line and a source or a drain coupled to a read bit line. The 8-transistor SRAM cell is adapted to prevent the value of the bit stored in the cell from changing state while the first and second read transistors affect the signal asserted during the read operation on the read bit line coupled to the cell.

According to a third aspect of the exemplary embodiments, there is provided an integrated circuit which includes a memory device. The memory device including: a plurality of 8-transistor SRAM cells arranged in columns and rows, with each 8-transistor SRAM cell including: two pull-up transistors and two pull-down transistors in cross-coupled inverter configuration for storing a single data bit; first and second pass-gate transistors having a gate terminal coupled to a write word line and a source or drain of each of the pass-gate transistors coupled to a write bit line, the first and second pass-gate transistors each having a shared source or drain terminal with one of the pull-down transistors; an inner junction diode at each shared source/drain terminal of the shared source/drain terminals to block charge transfer from the write bit line into the cell; and first and second read transistors coupled to the two pull-up and two pull-down transistors, one of the read transistors having a gate terminal coupled to a read word line and a source or a drain coupled to a read bit line. The 8-transistor SRAM cell is adapted to prevent the value of the bit stored in the cell from changing state while the first and second read transistors affect the signal asserted during the read operation on the read bit line coupled to the cell.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

The present exemplary embodiments are directed to an 8-transistor SRAM cell in which column select writing functionality is enabled without creating cell disturbs during column select writing. In the exemplary embodiments, the pass-gates in the 8-transistor SRAM cell are altered to permit higher performance in the pull-down (write mode) configuration and lower performance in the pull-up mode, thus retaining the write margin advantage of the 8-transistor SRAM cell. By keeping the pull-up mode for the pass-gate weak, column select writing mode is permitted without disturbing adjacent bits.

Figure 1:
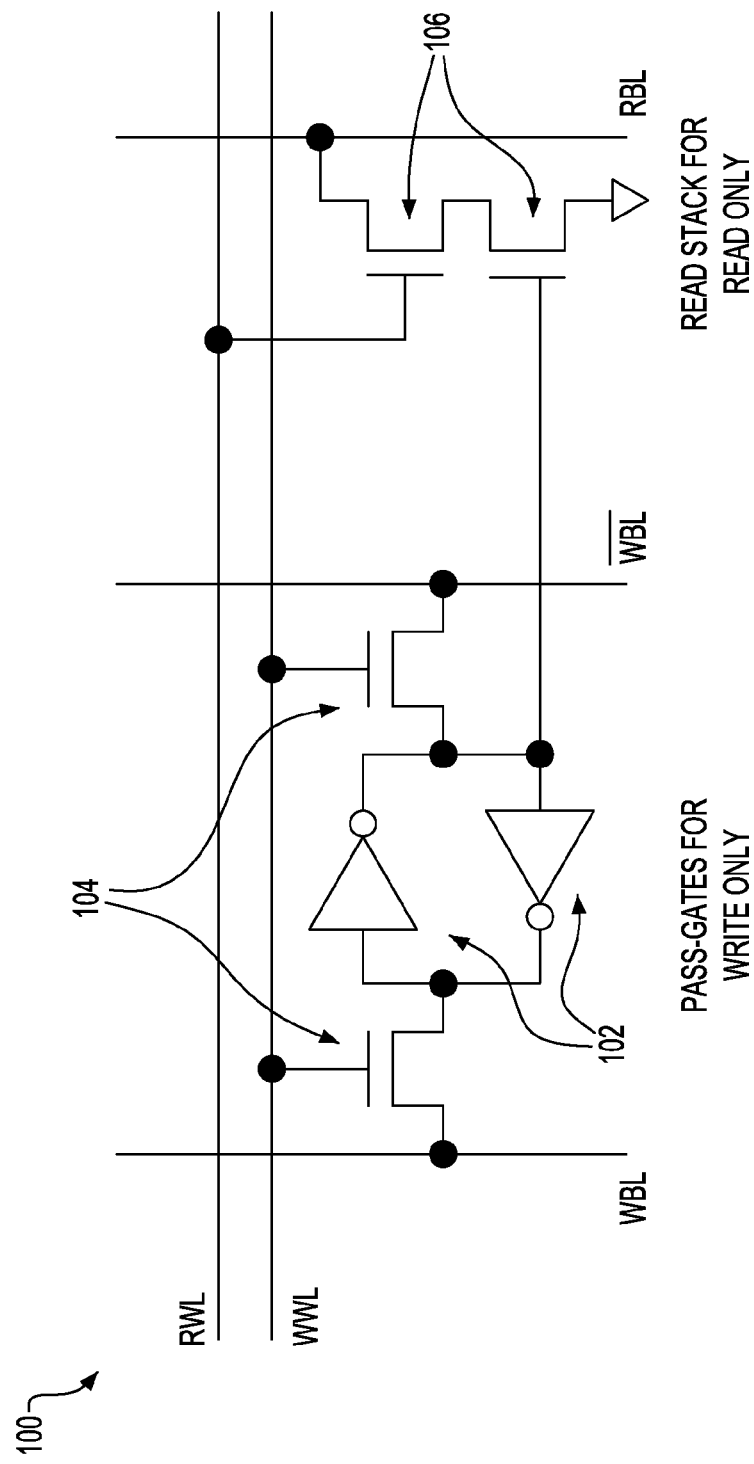
FIG. 1 is a circuit schematic of an 8-transistor SRAM cell.

Referring to the Figures in more detail, and particularly referring to FIG. 1, there is illustrated a block diagram of an 8-transistor SRAM 100 which includes cross-coupled inverters 102 for storing a bit and pass-gates 104 for writing a bit. Bits are read through read transistors 106. As noted previously, the two read transistors 106 are added to create a disturb-free read mechanism. Since read and write are controlled by separate devices within the 8-transistor SRAM cell, the two functions of read and write are entirely decoupled.

However, as also noted previously, column select functionality is prohibited in the 8-transistor SRAM cell. The reason for this is that the 8-transistor SRAM cell is optimized for writing so that any bit on a write word line may write to all cells on the write word line, whether intended or not.

Figure 2:
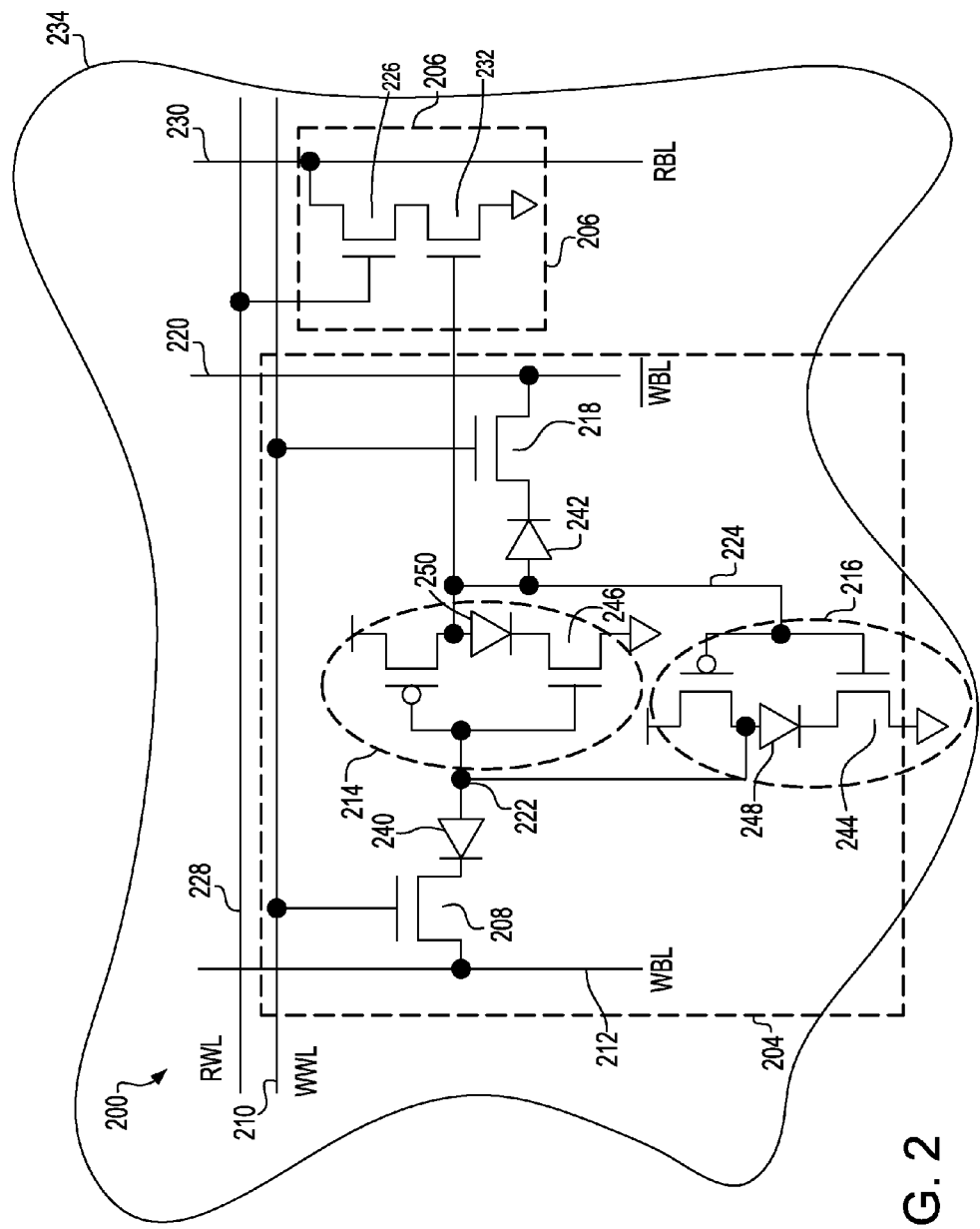
FIG. 2 is a circuit schematic of an exemplary embodiment of an 8-transistor SRAM cell having diodes.

FIG. 2 is a block diagram of an 8-transistor SRAM cell (or just cell) in accordance with an exemplary embodiment. With reference to FIG. 2, the cell 200 may include a plurality of transistors. A first group 204 of the plurality of transistors may be employed for storing data in the cell 200. A second group 206 of the plurality of transistors may be employed for affecting a signal coupled to the second group 206 of the plurality of transistors. The second group 206 may be mutually exclusive from the first group 204.

More specifically, the first group 204 may include a first transistor 208 (such as an N-type field effect transistor (NFET)) coupled (such as via a gate terminal) to a first word line (such as a write word line (WWL)) 210 such that the first word line 210 may serve to activate the first transistor 208. The first transistor 208 may be coupled (such as via a source/drain terminal) to a first bit line 212 (such as write bit line (WBL)). The other source/drain terminal may be coupled to an input of a first logic gate 214, such as an inverter and an output of a second logic gate 216, such as an inverter, through diode 240.

The first and second logic gates 214, 216 may include a pair of coupled pull-down and pull-up transistors (such as an NFET coupled with a P-type field effect transistor (PFET)) in inverter configuration as shown in FIG. 2.

The diode 240, which is oriented to block current flow into the cell from the first bit line 212, may be a separate device or more preferably, is integrated into the existing SRAM cell structure to minimize cell size. As will be seen, the pass-gate transistor 208 and the adjacent pull-down transistor 244 of inverter 216 share an active area and it is preferred that the diode 240 be formed within the shared diffusion structure between these two devices.

The first group 204 may include a second transistor 218, such as an NFET, coupled (such as via a gate terminal) to the first word line 210 such that the first word line 210 may serve to activate the second transistor 218. The second transistor 218 may be coupled (such as via a source/drain terminal) to the output of the first logic gate 214 and the input of the second logic gate 216 through a diode 242. The other source/drain terminal of transistor 218 may be coupled to a second bit line 220 (such as a write bit line complement (WBLb)).

The diode 242, which is oriented to block current flow into the cell from the second bit line 220, may be a separate device or, more preferably, is integrated into the existing SRAM cell structure to avoid any area penalty. As will be seen, the transistor 218 and the adjacent pull-down transistor 246 of inverter 214 share an active area and it is preferred that the diode 242 be formed in the shared diffusion structure between these two devices.

Diodes 248 and 250 are parasitic diodes formed by the resulting 8T-SRAM cell structure and fabrication process flow in this exemplary embodiment. While these diodes 248 and 250 are not needed for cell functionality, they do not impede proper operation as the diodes are oriented such that proper current flow directions are allowed.

A voltage of a first node 222 at the input of the first logic gate 214 and the output of the second logic gate 216 may serve as a value (e.g., of a bit) stored in the cell 200. Alternatively, a voltage at another node included in the first group 204 may serve as the value stored in the cell 200. For example, the voltage of a second node 224 at the output of the first logic gate 214 and the input of the second logic gate 216 may serve as the value stored in the cell 200. Although the first and second transistors 208, 218 are coupled to the same word line 210, in some embodiments, the first and second transistors 208, 218 may be coupled to different word lines. In this manner, in some embodiments, the first group 204 may include six transistors and four integrated diodes.

The second group 206 may include a seventh transistor 226 (e.g., an NFET) of the cell 200 coupled (e.g., via a gate terminal) to a read word line (RWL) 228 such that the second word line 228 may serve to activate the seventh transistor 226. The seventh transistor 226 may be coupled (e.g., via a drain or source terminal) to a third bit line 230 (RBL). During a read operation, the second group 206 may cause the value of a signal on the third bit line 230 to track the value stored by the cell 200 (e.g., the value of the first node 222 of the first group 204). Therefore, the third bit line 230 may serve as an output of the cell 200.

Further, the second group 206 may include an eighth transistor 232 (e.g., NFET) of the cell 200 coupled to the seventh transistor 226 (e.g., a source or drain terminal of the seventh transistor 226) via a drain or source terminal. The eighth transistor 232 may be coupled (e.g., via a source or drain terminal) to a low voltage, such as ground. Additionally, the eighth transistor 232 may be coupled (e.g., via a gate terminal) to the second node 224 such that the voltage of the second node 224, which is related to the voltage of the first node 222 that serves as the value stored in the cell 200, may serve to activate the eighth transistor 232. In this manner, the second group 206 may include two transistors. Although the cell 200 includes NFET transistors and logic devices, such as inverters (each of which may include an NFET coupled to a PFET), different types of transistors and/or logic devices may be employed.

The cell 200 may comprise one or more portions of a memory 234. More specifically, although only one cell is shown, the memory 234 may include a plurality of cells 200 arranged into rows and/or columns. The memory 234 may form part of an integrated circuit.

It would be desirable to perform the column select function in an 8-transistor SRAM cell but as noted above, it is typically prohibited because of write disturbs. It is the presence of diode 240 adjacent to pass-gate 208 and diode 242 adjacent to pass-gate 218 that allows the enablement of column select in the cell 200. In the exemplary embodiments, the pass-gates 208 and 218 in series combination with the diodes 240 and 242 permit higher performance in the pull-down mode (writing a logical "0" from the bit line into the cell) configuration and lower performance in the pull-up mode (when a logical "1" on the bit line pulls up/disturbs the cell). Such asymmetric behavior retains the write margin advantage of the 8-transistor SRAM cell while providing for a way to disable writing of a cell by appropriately setting the BL voltages (i.e. column select). When a WWL 210 is activated, those bits to be written should have their WBL 212 and WBLb 220 lines set to the true and complement versions of the new data. Those bits tied to this WWL 210 that should not be written should have both WBL 212 and WBLb 220 held high—with the configured diodes blocking any charge transfer that would otherwise disturb the cell.

Figure 3:
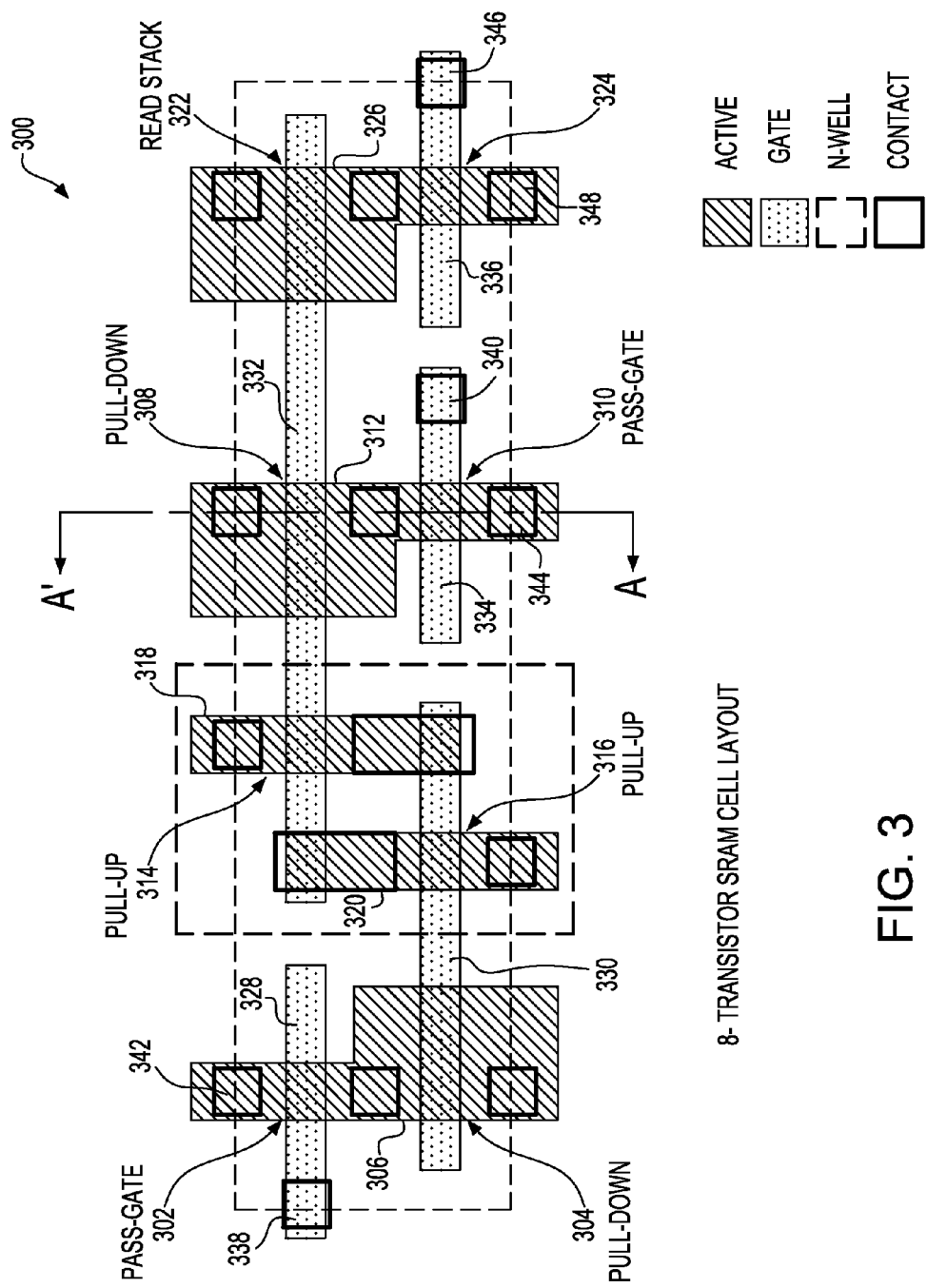
FIG. 3 is a top view of a layout of an 8-transistor SRAM cell.

FIG. 3 presents a top-down view of an exemplary embodiment of an 8-transistor SRAM cell layout 300, which contains active regions, isolation regions, gate structures, and contact structures. Additional mask levels are implied and should be well understood by those skilled in the art. The exemplary cell 300 may be fabricated in a conventional semiconductor substrate.

As shown in FIG. 3, pass-gate transistor 302 and pull-down transistor 304 are formed within a connected active region 306, with no isolation between them, and pull-down transistor 308 and pass-gate transistor 310 are formed within a connected active region 312. Pull-up transistors 314 and 316 are formed within active regions 318 and 320, respectively. Further, read transistors 322 and 324 are formed within a connected active region 326. The active regions 306, 312, 318, 320 and 326 may be formed within a semiconductor substrate and are separated from one another by dielectric isolation regions. Gate structures 328 and 330 are arranged above active region 306 to form gates of pass-gate transistor 302 and pull-down transistor 304, respectively. Above active region 312, gate structures 332 and 334 are arranged to form gates of pull-down transistor 308 and pass-gate transistor 310, respectively. In a similar manner, gate structure 332 forms gates of pull-up transistor 314 and one of the read transistors 322, gate structure 330 additionally forms the gate of pull-up transistor 316 and gate structure 336 forms the gate of the second read transistor 324. Also shown in FIG. 3 are contact 338 for coupling with a write word line, contact 340 for also coupling with the write word line, contact 342 for coupling with a write bit line, contact 344 for coupling with the write bit line complement, contact 346 for coupling with the read word line and contact 348 for coupling with the read bit line.

Figure 4:
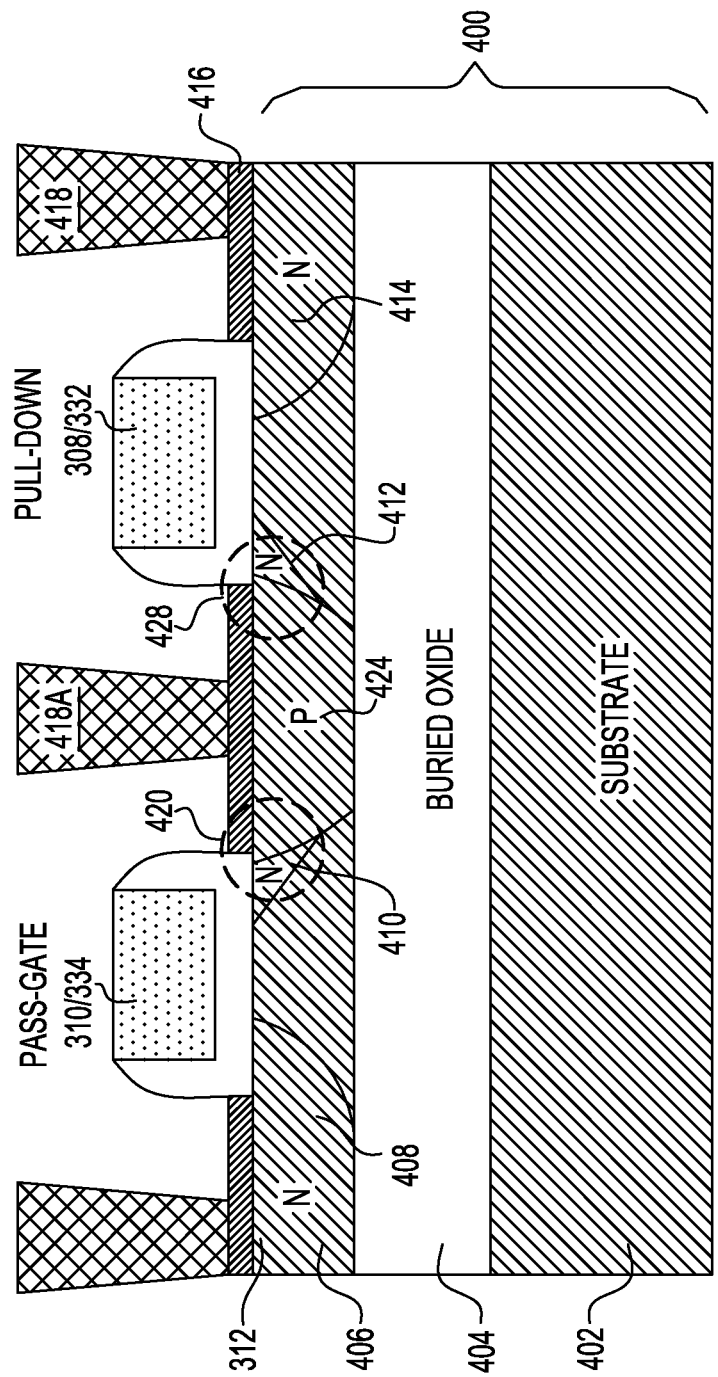
FIG. 4 is a cross-sectional view of FIG. 3 in the direction of arrows A-A' showing the exemplary embodiment of the diodes of FIG. 2.

FIG. 4 is a cross-section of FIG. 3 in the direction of arrows A-A'. For purposes of illustration and not limitation, semiconductor structure 400 is a semiconductor on insulator (SOI) structure and includes a semiconductor substrate 402, an insulating layer 404 and top semiconductor on insulator (SOI) layer 406. The insulating layer 404 may be an oxide and may be referred to as a buried oxide layer. Further shown are pass-gate transistor 310, gate structure 334 for pass-gate transistor 310, pull-down transistor 308 and gate structure 332 for pull-down transistor 308. Pass-gate transistor 310 and pull-down transistor 308 are connected by active area 312 within SOI layer.

Pass-gate transistor 310 may have source/drains 408 and 410 while pull-down transistor 308 may have source/drains 412 and 414. Source/drain 410 may be connected to source/drain 412 in a shared diffusion 424 as shown in FIG. 4. Connected to the various sources/drains 408, 410, 412, 414 may be silicide contacts 416 and metal contacts 418.

As noted previously, pass-gate transistors (208 and 218 in FIGS. 2; 302 and 310 in FIG. 3) may further be connected in series with an inner diode (240 and 242 in FIG. 2). As further noted previously, the inner diode may be a separate device with separate isolation and active regions, but may preferably be integrated into the existing SRAM cell structure to minimize cell area. The inner diode may be formed on shared diffusion between the pass-gate transistor and the pull-down transistors of the logic devices 214 and 216.

FIG. 4 illustrates a preferred exemplary embodiment where the pn junction diode 420 (diode 240 in FIG. 2) may be formed by ion implantation, in which an n-type implant and a p-type implant form regions 410 and 424, respectively. As depicted in FIG. 4, such regions could be preferably formed by a shallow n-type source/drain implant prior to gate spacer formation followed by a deep p-type implant after gate spacer formation. As a result, the silicide contact 416 and metal contact 418A would electrically connect the p-type region 424 to the pull-up transistor in gate 214 and input of the other storage inverter, gate 216, thereby creating a series junction diode 420 (240 in accordance with FIG. 2). In such a structure, it should be noted that a second parasitic diode 428 is simultaneously formed as the shallow n-type source/drain implant would also form the source/drain region for the pull-down transistor, thus creating series junction diode 248 in accordance with FIG. 2. As previously mentioned, while this diode is not desired, it does not negatively impact cell operation. The structure and process used to form diodes 242 and 250 in FIG. 2 are analogous to that described above for diodes 240 and 248.

Figure 5:
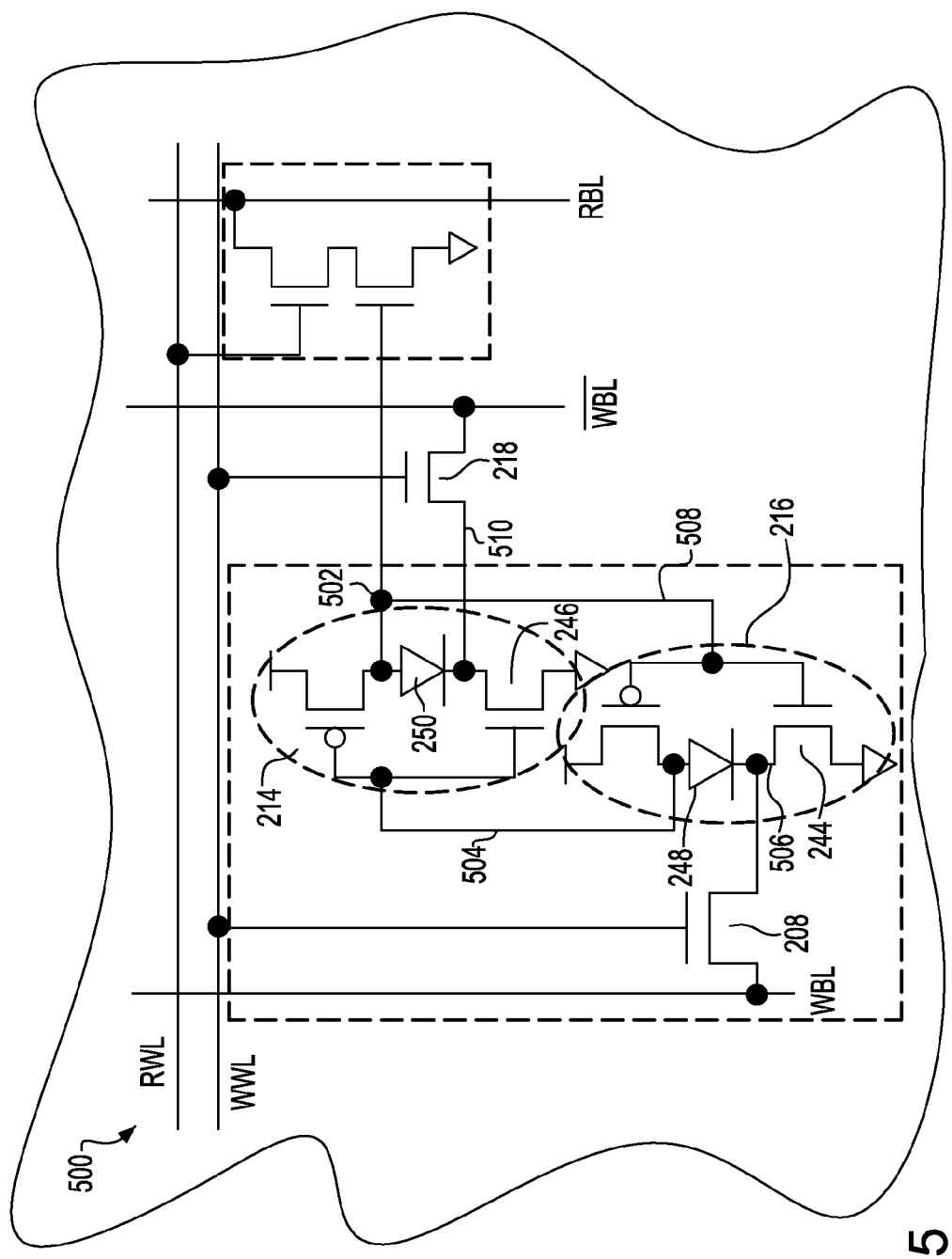
FIG. 5 is a circuit schematic of another exemplary embodiment of an 8-transistor SRAM cell.

Referring now to FIG. 5, an alternate exemplary embodiment cell 500 is illustrated wherein junction diodes 248, 250 are used to split the cross-couple storage nodes in the cell. Junction diode 248 splits the original cross-couple node into separate nodes 504 and 506. During a column select operation, pass-gate transistor 208 would turn on to disturb node 506; however, the presence of junction diode 248 prohibits charge from entering node 504, which dynamically stores the cell state. During normal cell standby operation, diode 248 allows for proper cross-coupled inverter operation to statically maintain cell state. In a similar fashion, diode 250 splits the opposite cross-couple node into separate nodes 508 and 510 to enable column select functionality.

Figure 6:
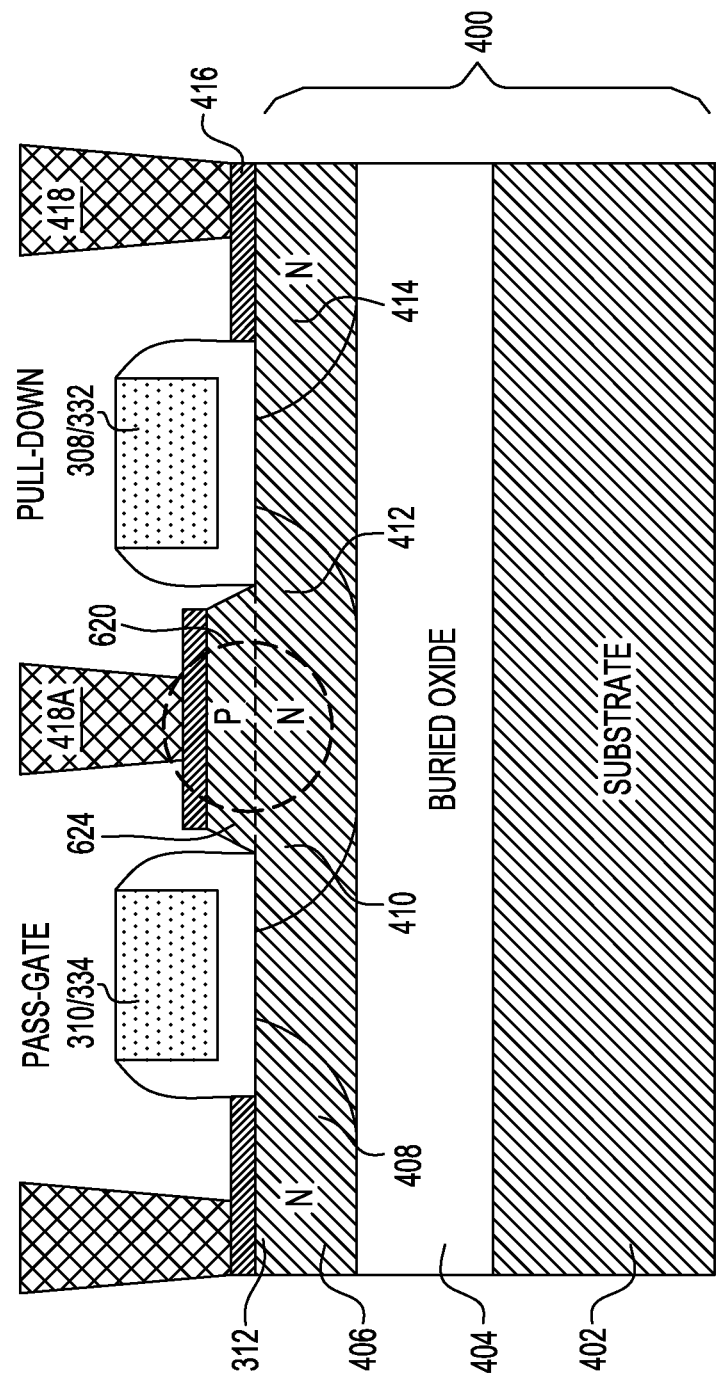
FIG. 6 is a cross-sectional view of FIG. 3 in the direction of arrows A-A' showing the exemplary embodiment of the diodes of FIG. 5.

FIG. 6 illustrates a structure cross-section in accordance with the alternate exemplary embodiment of FIG. 5. Diode 620 may be formed as part of the mutual source/drain 410/412 shared by the pass-gate transistor 310 and the adjacent pull-down transistor 308. The diode 620 may be formed by epitaxial growth of a p-type layer 424 (for example, boron or boron fluoride (BF$_2$)). This epitaxial growth step may be specifically added for this purpose or may leverage existing steps in the process (e.g. for PFET raised source/drain formation). The combination of p-type layer 624 and the mutual source/drain 410/412 form a pn junction diode 620. The diode 620 created is schematically illustrated as diode 248 or 250 in the circuit diagram in FIG. 5.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. An 8-transistor SRAM cell comprising:
   two pull-up transistors and two pull-down transistors in cross-coupled inverter configuration for storing a single data bit;
   first and second pass-gate transistors having a gate terminal coupled to a write word line and a source or drain of each of the pass-gate transistors coupled to a write bit line, the first and second pass-gate transistors each having an active region and a diffusion area shared with one of the pull-down transistors;
   an inner junction diode at each shared diffusion area between one of the pass-gate transistors and one of the pull-down transistors oriented to block charge transfer from the write bit line into the cell; and
   first and second read transistors coupled to the two pull-up and two pull-down transistors, one of the read transistors having a gate terminal coupled to a read word line and a source or a drain coupled to a read bit line;
   wherein the 8-transistor SRAM cell is adapted to prevent the value of the bit stored in the cell from changing state while the first and second read transistors affect the signal asserted during the read operation on the read bit line coupled to the cell.

2. The 8-transistor SRAM cell of claim 1 wherein the 8-transistor SRAM cell has column select writing enabled for writing a value to the 8-transistor SRAM cell without inadvertently also writing a value to another 8-transistor SRAM cell.

3. The 8-transistor SRAM cell of claim 1 wherein the 8-transistor SRAM cell has column select writing functionality enabled to write a value to the 8-transistor SRAM cell, the write bit lines of the 8-transistor SRAM cell being set to a true and complement version of the value while avoiding inadvertently writing to other 8-transistor SRAM cells tied to the same write word line by setting write bit lines of the other 8-transistor SRAM cells to a logical high value, wherein the other 8-transistor SRAM cells have inner junction diodes oriented to block charge transfer from the write bit lines into the other 8-transistor SRAM cells.

4. The 8-transistor SRAM cell of claim 1 wherein the inner junction diodes are N/P junction diodes or P/N junction diodes formed on the shared diffusion areas of the pass-gate and pull-down transistors.

5. The 8-transistor SRAM cell of claim 1 wherein the inner junction diodes are N/P junction diodes or P/N junction diodes formed by ion implantation and oriented in series with the pass-gate transistor to block charge transfer from the write bit lines into the cell.

6. The 8-transistor SRAM cell of claim 1 wherein the inner junction diodes are N/P junction diodes or P/N junction diodes formed by epitaxial growth and oriented to split a cross-coupled storage node and block charge transfer from the write bit lines into the cell.

7. A memory device comprising:
   a plurality of 8-transistor SRAM cells arranged in columns and rows, with each 8-transistor SRAM cell comprising:
   two pull-up transistors and two pull-down transistors in cross-coupled inverter configuration for storing a single data bit;
   first and second pass-gate transistors having a gate terminal coupled to a write word line and a source or drain of each of the pass-gate transistors coupled to a write bit line, the first and second pass-gate transistors each having an active region and a diffusion area shared with one of the pull-down transistors;
   an inner junction diode at each shared diffusion area between one of the pass-gate transistors and one of the pull-down transistors to block charge transfer from the write bit line into the cell; and
   first and second read transistors coupled to the two pull-up and two pull-down transistors, one of the read transistors having a gate terminal coupled to a read word line and a source or a drain coupled to a read bit line;
   wherein the 8-transistor SRAM cell is adapted to prevent the value of the bit stored in the cell from changing state while the first and second read transistors affect the signal asserted during the read operation on the read bit line coupled to the cell.

8. The memory device of claim 7 wherein the memory device has column select writing enabled for writing a value to an 8-transistor SRAM cell without inadvertently also writing a value to another 8-transistor SRAM cell.

9. The memory device of claim 7 wherein the memory device has column select functionality enabled to write a value to one 8-transistor SRAM cell of the plurality of 8-transistor SRAM cells, the write bit lines of the one 8-transistor SRAM cell being set to a true and complement version of the value, while avoiding inadvertently writing to other 8-transistor SRAM cells of the plurality of 8-transistor SRAM cells tied to the same write word line by setting write bit lines of the other 8-transistor SRAM cell to a logical high value, wherein the other 8-transistor SRAM cells have inner junction diodes oriented to block charge transfer from the write bit lines into the other 8-transistor SRAM cells.

10. The memory device of claim 7 wherein the plurality of 8-transistor SRAM cells are arranged in columns and rows and wherein the memory device has column select writing enabled to write a value to an 8-transistor SRAM cell without inadvertently also writing a value to an 8-transistor SRAM cell in the same column or an adjacent column.

11. The memory device of claim 7 wherein diodes are N/P junction diodes or P/N junction diodes formed on the shared diffusion areas of the pass-gate and pull-down transistors.

12. The memory device of claim 7 wherein the diodes are N/P junction diodes or P/N junction diodes formed by ion implantation and oriented in series with the pass-gate transistor to block charge transfer from the write bit lines into the cell.

13. The memory device of claim 7 wherein the diodes are N/P junction diodes or P/N junction diodes formed by epitaxial growth and oriented to split a cross-coupled storage node and block charge transfer from the write bit lines into the cell.

14. An integrated circuit comprising:
a memory device comprising:
a plurality of 8-transistor SRAM cells arranged in columns and rows, with each 8-transistor SRAM cell comprising:
two pull-up transistors and two pull-down transistors in cross-coupled inverter configuration for storing a single data bit;
first and second pass-gate transistors having a gate terminal coupled to a write word line and a source or drain of each of the pass-gate transistors coupled to a write bit line, the first and second pass-gate transistors each having an active region and a diffusion area shared with one of the pull-down transistors;
an inner junction diode at each shared diffusion area between one of the pass-gate transistors and one of the pull-down transistors to block charge transfer from the write bit line into the cell; and
first and second read transistors coupled to the two pull-up and two pull-down transistors, one of the read transistors having a gate terminal coupled to a read word line and a source or a drain coupled to a read bit line;
wherein the 8-transistor SRAM cell is adapted to prevent the value of the bit stored in the cell from changing state while the first and second read transistors affect the signal asserted during the read operation on the read bit line coupled to the cell.

15. The integrated circuit of claim 14 wherein the memory device has column select writing enabled for writing a value to an 8-transistor SRAM cell without inadvertently also writing a value to another 8-transistor SRAM cell.

16. The integrated circuit of claim 14 wherein the memory device has column select functionality enabled to write a value to one 8-transistor SRAM cell of the plurality of 8-transistor SRAM cells, the write bit lines of the one 8-transistor SRAM cell being set to a true and complement version of the value, while avoiding inadvertently writing to other 8-transistor SRAM cells of the plurality of 8-transistor SRAM cells tied to the same write word line by setting write bit lines of the other 8-transistor SRAM cell to a logical high value, wherein the other 8-transistor SRAM cells have inner junction diodes oriented to block charge transfer from the write bit lines into the other 8-transistor SRAM cells.

17. The integrated circuit of claim 14 wherein the plurality of 8-transistor SRAM cells are arranged in columns and rows and wherein the memory device has column select writing enabled to write a value to an 8-transistor SRAM cell without inadvertently also writing a value to an 8-transistor SRAM cell in the same column or an adjacent column.

18. The integrated circuit of claim 14 wherein diodes are N/P junction diodes or P/N junction diodes formed on the shared diffusion areas of the pass-gate and pull-down transistors.

19. The integrated circuit of claim 14 wherein the diodes are N/P junction diodes or P/N junction diodes formed by ion implantation and oriented in series with the pass-gate transistor to block charge transfer from the write bit lines into the cell.

20. The integrated circuit of claim 14 wherein the diodes are N/P junction diodes or P/N junction diodes formed by epitaxial growth and oriented to split a cross-coupled storage node and block charge transfer from the write bit lines into the cell.

* * * * *